United States Patent [19]
Gilbert

[11] Patent Number: 6,087,883
[45] Date of Patent: Jul. 11, 2000

[54] MULTI-TANH DOUBLETS USING EMITTER RESISTORS

[75] Inventor: Barrie Gilbert, Portland, Oreg.

[73] Assignee: Analog Devices, Inc., Norwood, Mass.

[21] Appl. No.: 09/212,089

[22] Filed: Dec. 15, 1998

Related U.S. Application Data

[60] Provisional application No. 60/069,488, Dec. 15, 1997.

[51] Int. Cl.[7] ................................................ G06F 7/44
[52] U.S. Cl. ........................................... 327/355; 327/356
[58] Field of Search ........................ 327/355, 357, 327/356, 359, 118, 119, 116

[56] References Cited

U.S. PATENT DOCUMENTS

| | | | |
|---|---|---|---|
| 5,532,637 | 7/1996 | Khoury et al. | 327/359 |
| 5,936,465 | 8/1999 | Kimura | 330/252 |
| 6,037,825 | 3/2000 | Kung | 327/359 |

Primary Examiner—Tuan T. Lam
Assistant Examiner—Linh Nguyen
Attorney, Agent, or Firm—Marger Johnson & McCollom

[57] ABSTRACT

Multi-tanh cells constructed in accordance with the present invention provide improved input voltage range by utilizing resistors connected between the emitters of the transistors and the corresponding bias current sources. The resistor values and emitter area ratios are chosen to achieve substantially distortion-free transconductance functions over wide input voltage ranges. This improved input voltage range results in a corresponding improvement in dynamic range because the emitter resistances do not increase the noise significantly at low input voltage levels. In one embodiment, a separate resistor is connected in series with the emitter of each of the four doublet transistors. Another embodiment utilizes only a single bias current source and two emitter resistors to achieve better linearity and lower noise. To achieve higher effective emitter area ratios, an emitter follower scheme can be used to synthesize all or a portion of the area ratio. A series-connected version provides even wider input voltage range.

12 Claims, 5 Drawing Sheets

| A | $V_E$ (mVP) | $V_{1dB}$ (dBV) | $\Delta_{NOISE}$ (dB) | $\Delta_{DR}$ (dB) | $\Delta_{GM}$ (dB) |
|---|---|---|---|---|---|
| 4 | 439.7 | −23.38 | 0.16 | −0.12 | −0.09 |
| 5 | 112.3 | −22.00 | 0.62 | −0.12 | −0.37 |
| 6 | 74.06 | −21.69 | 0.94 | −0.13 | −0.61 |
| 8 | 52.02 | −21.21 | 1.37 | −0.08 | −0.98 |
| 10 | 44.53 | −20.84 | 1.67 | −0.01 | −1.26 |
| 20 | 36.90 | −19.66 | 2.49 | +0.35 | −2.18 |
| 50 | 38.58 | −18.03 | 3.48 | +0.99 | −3.47 |
| 100 | 43.62 | −16.74 | 4.20 | +1.56 | −4.51 |
| 200 | 51.02 | −13.51 | 4.92 | +4.07 | −5.61 |
| 500 | 64.27 | −13.52 | 5.86 | +4.06 | −7.15 |
| 1000 | 77.13 | −12.07 | 6.59 | +3.84 | −8.38 |

MULTI-TANH DOUBLETS USING EMITTER RESISTORS

CROSS REFERENCE TO RELATED APPLICATIONS

This application claims priority from U.S. Provisional Patent Application Ser. No. 60/069,488, filed on Dec. 15, 1997, titled "Hybrid Multi-Tanh Doublet", which is incorporated herein by reference.

BACKGROUND OF THE INVENTION

1. Field of the Invention

The present invention is related to the field of transconductance cells, and more particularly, to multi-tanh doublet transconductance cells using emitter resistors.

2. Description of the Related Art

Figure 1:
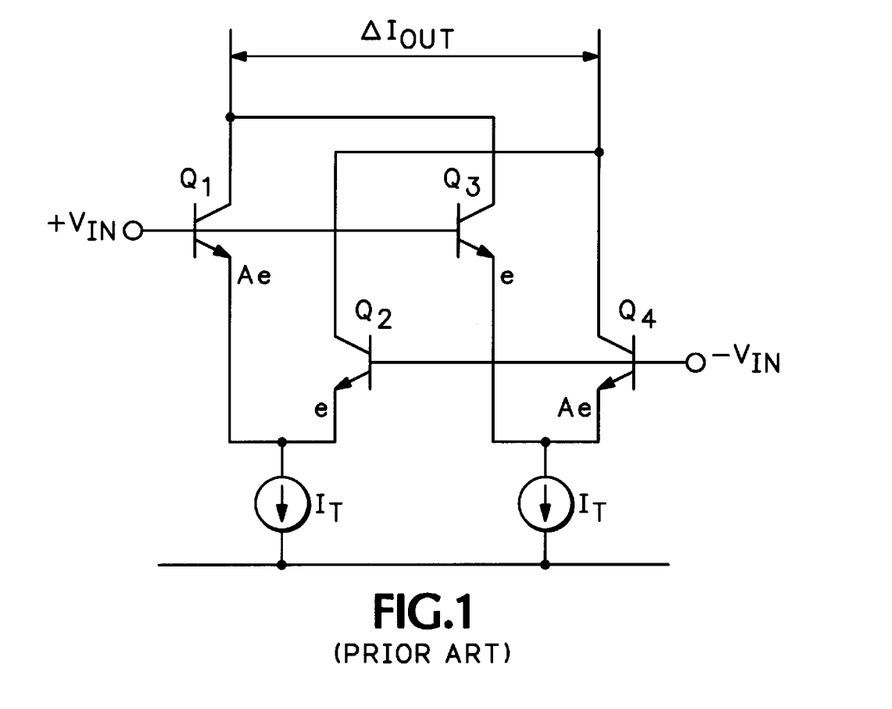
FIG. 1 is a circuit diagram of a prior art simple multi-tanh doublet cell.

The output of a differential pair of common-emitter bipolar junction transistors (BJTs) has a hyperbolic tangent (tanh) type response to the input voltage applied between the base terminals. If this input base voltage is offset, the tanh function is also offset along the input voltage axis. Bipolar transistor cells which combine a number of offset tanh functions from a number of differential pairs of transistors are known as "multi-tanh" cells. By using at least two pairs of transistors, each with a different base offset voltage, a multi-tanh cell splits the individual transconductance functions of the differential pairs. Accordingly, the overall transconductance of the composite cell, achieved by summing the individual current outputs in phase, is more nearly linear, thereby allowing the cell to handle larger voltage swings at its input. FIG. 1 is a circuit diagram of a prior art multi-tanh cell that uses two differential pairs of BJTs, namely Q1–Q2 and Q3–Q4. Each pair is biased by a current source that supplies a bias current $I_T$, which is also known as a tail current. Transistors Q2 and Q3 are fabricated with unit emitter areas "e", while transistors Q1 and Q4 are fabricated with emitter areas "Ae", that is, "A" times the emitter area of transistors Q2 and Q3. The cell of FIG. 1 will be referred to herein as a simple multi-tanh doublet.

The input base voltage of the left pair Q1–Q2 is offset from zero by an offset voltage $V_{OS}$ in one direction, while the input base voltage of the right pair Q3–Q4 is offset from zero by $V_{OS}$ in the other direction. The offset voltage is given by:

$$V_{OS} = V_T \ln A \quad \text{(Equation 1)}$$

where $V_{OS}$ is the offset voltage, A is the emitter area ratio, and $V_T$ is the thermal voltage (about 26 mVP, where "P" denotes "PTAT" or Proportional To Absolute Temperature with a reference temperature of about 300K). Although the input offset voltage is introduced through the use of the emitter area ratio A in the circuit of FIG. 1, other techniques can be used to generate the input offset voltage.

Figure 2:
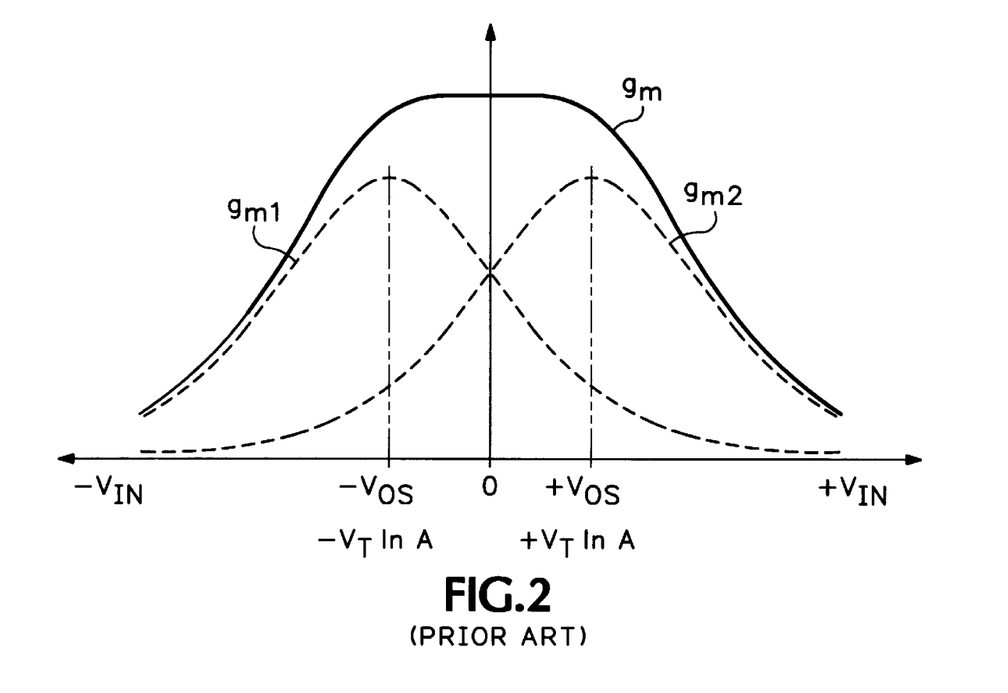
FIG. 2 is a graph of the transconductance function of the circuit of FIG. 1 as a function of input voltage signal using optimal area ratios.

FIG. 2 is a graph showing the transconductance functions of the left pair ($g_{m1}$) and the right pair ($g_{m2}$) as a function of input base voltage for the circuit of FIG. 1. The functions have peaks that are laterally offset along the input base voltage (horizontal) axis from zero by $-V_{OS}$ and $+V_{OS}$ respectively.

FIG. 2 also shows the transconductance of the overall cell ($g_m$), obtained by summing $g_{m1}$ and $g_{m2}$. As can be seen, the overall transconductance is nearly linear over a much wider range of input voltages ($2 \times V_{OS}$) than available with either one of the differential pairs.

If the emitter area ratio is changed, then $V_{OS}$ is also changed according to Equation 1 above. This moves the transconductance curves of $g_{m1}$ and $g_{m2}$ laterally, and thus, also affects their sum $g_m$. If $V_{OS}$ is too low, $g_{m1}$ and $g_{m2}$ will be too close, and $g_m$ will have a hump at $V_{IN}=0$. If $V_{OS}$ is too high, $g_{m1}$ and $g_{m2}$ will be too far apart, and $g_m$ will have two humps with a valley in the middle where $V_{IN}=0$.

There is only one value of the emitter area ratio A where linearity of $g_m$ will be optimized, i.e. which minimizes distortion of the dynamic range. That value is found to be $A=A_0=3.732$, and is the case plotted in FIG. 2.

Applying Equation 1 for $A=A_0$ gives $V_{OS}=34.17$ mVP. Accordingly, the doublet of FIG. 1 can provide linear transconductance over an input voltage swing of about 2×34.17 mV=68.34 mV. Although larger input voltage swings are often desirable, this limitation is fundamental to the simple doublet cell of FIG. 1. It can not be overcome by merely increasing A, since first, this would introduce distortion, as said above; second, there would be diminishing returns, since $V_{OS}$ increases only logarithmically with A as seen from Equation 1; and third, making the emitter areas larger would scale the device size, which would increase the undesirable junction capacitances.

Accordingly, a need remains for a doublet cell with a transconductance function exhibiting substantially perfect linearity over a a wide input voltage range.

SUMMARY OF THE INVENTION

Multi-tanh cells constructed in accordance with the present invention provide improved input voltage range by utilizing resistors connected between the emitters of the transistors and the corresponding bias current sources. The resistor values and emitter area ratios are chosen to achieve substantially distortion-free transconductance functions over wide input voltage ranges. This improved input voltage range results in a corresponding improvement in dynamic range because the emitter resistances do not increase the noise significantly at low input voltage levels.

A doublet cell according to a first embodiment of the present invention includes four emitter resistors; each is coupled between the emitter of one transistor and the corresponding bias current source. Optimized resistance values give rise to a large input voltage capacity as well as low noise.

A second embodiment of a doublet cell in accordance with the present invention includes only one bias current source and two emitter resistors; each resistor is coupled between the current source and the common emitters of each transistor pair.

In a variation of the second embodiment, the input offset voltages are provided by two offset resistors, two offset current sources for driving offset currents through each of the offset resistors, and two transistors that function as emitter followers. The offset currents can be adjusted to generate adjustable offset voltages across the offset resistors. The circuit thus acquires a very large effective emitter area ratio.

In a third embodiment of a doublet cell in accordance with the present invention, a multi-tanh doublet cell is connected with the input terminals in series to provide even wider input voltage range.

The multi-tanh cells constructed in accordance with the present invention and described herein are also referred to as "hybrid" doublets since they utilize emitter resistances as well as real and/or effective emitter area ratios.

The foregoing and other objects, features and advantages of the invention will become more readily apparent from the following detailed description of preferred embodiments of

DETAILED DESCRIPTION

Multi-Tanh Doublet With Emitter Resistances

Figure 3:
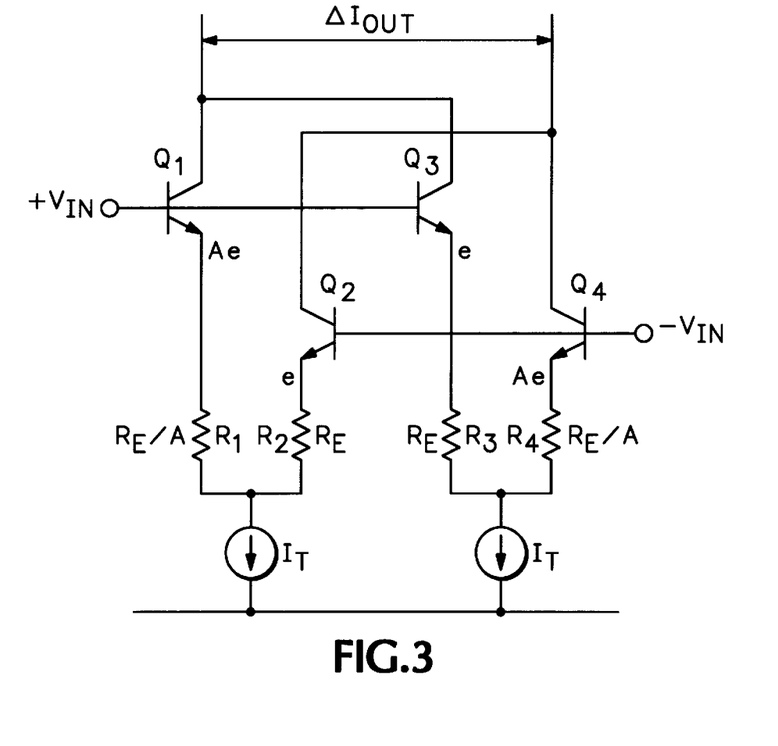
FIG. 3 is a circuit diagram of a multi-tanh doublet cell with emitter resistances constructed according to a first embodiment of the invention.

Referring now to FIG. 3, a first embodiment of a hybrid multi-tanh doublet in accordance with the present invention includes BJTs Q1, Q2, Q3 and Q4. Transistors Q2 and Q3 have unit emitter areas "e", while Q1 and Q4 have emitter areas of "Ae", where A is thus a scalar ratio of the emitter areas.

The doublet cell of FIG. 3 further includes emitter resistors R1, R2, R3 and R4, each coupled between one of the emitters of Q1, Q2, Q3, Q4 and the corresponding bias current source. The resistance of emitter resistor R2 can be treated as a free design parameter $R_E$. The optimum resistance of R3 is then $R_E$, and the optimum resistance of R1 and R4 is $R_E/A$, although other values may be chosen.

Figure 4:
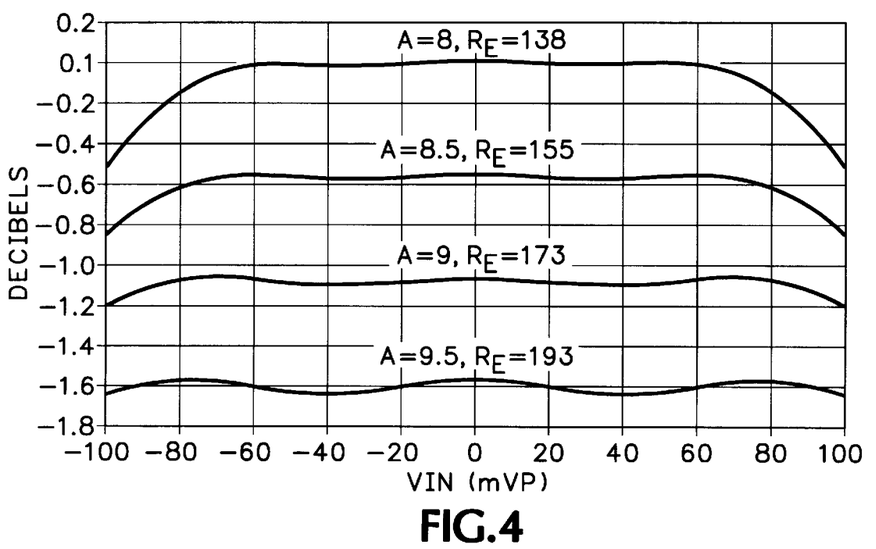
FIG. 4 is a graph of the incremental transconductance of the circuit of FIG. 3 for various pairs of design parameter values.

Referring to FIG. 4, the transconductance function $g_m$ of the doublet cell of FIG. 3 is centered on $V_{IN}=0$. The function is a three-humped, gently undulating $g_m$ function that is substantially linear, i.e., distortion-free. The exact shape of the function is determined by the choice of A and $R_E$, as seen immediately below.

Referring to FIG. 4, the incremental transconductance is plotted for A=8, $R_E$=138 Ω; A=8.5, $R_E$=155 Ω; A=9, $R_E$=173 Ω; and A=9.5, $R_E$=193 Ω, for a fixed value of $I_T$=500 μA. From FIG. 4 it is apparent that the incremental transconductance is substantially constant over a wider range of $V_{IN}$ than that afforded by the simple doublet. Even wider input ranges are attainable when lower overall gain and increased peak-to-peak ripple are tolerable.

The peak-to-peak ripple magnitude of the incremental transconductance is 0.007 dB for A=8, $R_E$=138 Ω, for which condition the input noise spectral density is 1.86 nV/√Hz. The ripple is 0.018 dB for A=8.5, $R_E$=155 Ω; 0.034 dB for A=9, $R_{E=1173}$ Ω; and 0.057 dB for A=9.5, $R_E$=193 Ω, at which point the input noise spectral density is 2.06 nV/√Hz.

Multi-Tanh Doublet Using Single Current Source

Figure 5:
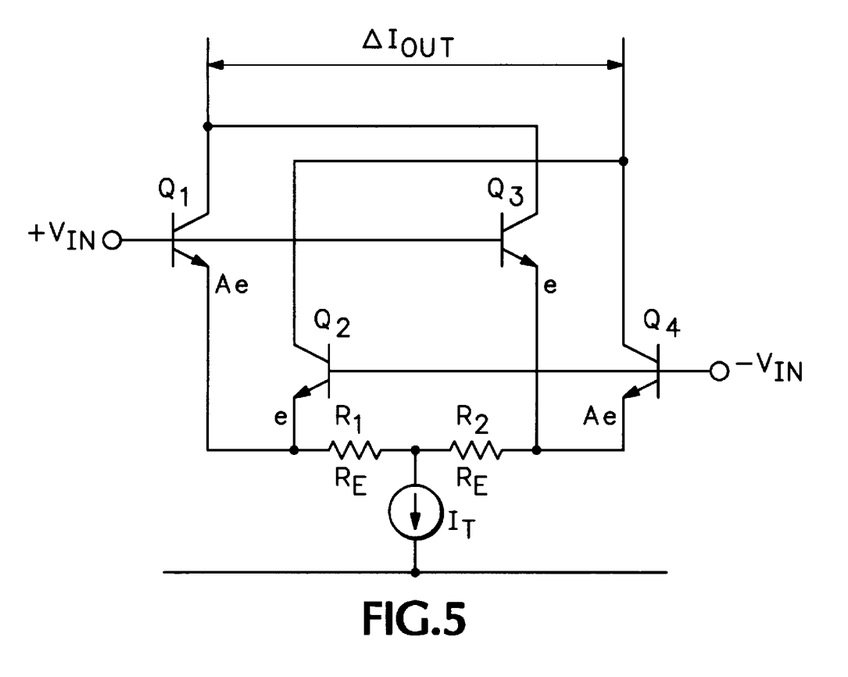
FIG. 5 is a circuit diagram of a multi-tanh hybrid doublet cell constructed according to a second embodiment of the invention.

FIG. 5 is a schematic diagram of another embodiment of a hybrid multi-tanh doublet in accordance with the present invention. The circuit of FIG. 5 includes two pairs of transistors Q1–Q2 and Q3–Q4 which have their collectors connected in-phase as in the circuit of FIG. 3, but with a single tail current source $I_E$. The tail current is split between the two differential pairs Q1–Q2 and Q3–Q4 by first and second emitter resistors R1 and R2, respectively, which preferably have equal resistances $R_E$. Coupling of the emitters changes the optimal (minimum distortion) value of the emitter area ratio A (from the optimal value of $A_0$=3.732 for the simple doublet). The behavior of the cell of FIG. 5 depends on the zero-signal voltage drop $V_E$ across emitter resistors R1, R2. For a given value of A, there is an optimal value of $V_E$ that minimizes distortion. The optimal value of $V_E$ increases for values of A up to 50, and then decreases again. For moderate values of A, a useful approximation for the optimized $V_E$ is given by:

$$V_E = V_T\left\{1 + \frac{4.268}{A - A_0}\right\} \quad \text{(Equation 2)}$$

where $A_0$=3.732, A is the actual emitter area ratio, $V_T$ is the thermal voltage, and $V_E$ is the required value of zero-signal voltage drop across emitter resistors R1 and R2.

As an example, using a moderate A=10, $I_T$=2 mAP and $V_E$=44.5 mVP, the $V_{1dB}$ occurs at −20.9 dBVP, while the third-order intercept $IH_3$ is now at −0.8 dBVP. The noise is 1.51 dB higher than for the simple doublet with A=4, operating at the same total tail current.

For extremely high values of A, conduction in Q2 and Q3 becomes insignificant for zero-signal conditions, and the circuit then resembles an emitter degenerated $g_m$ cell. On the other hand, when $R_E$ is very small, the circuit resembles a simple differential pair.

In the circuit of FIG. 5, any common mode noise in the current source is of little concern in most applications. Consequently, this cell not only has far better linearity than the equivalent emitter degenerated pair (obtained by simply removing the large transistors Q1 and Q4), but also lower noise, particularly in comparison to the simple doublet using dual current sources without emitter degeneration (which have a high level of uncorrelated noise). Accordingly, the multi-tanh doublet of FIG. 5 is a rare example of a "win-win" situation in this regard.

Figure 6:
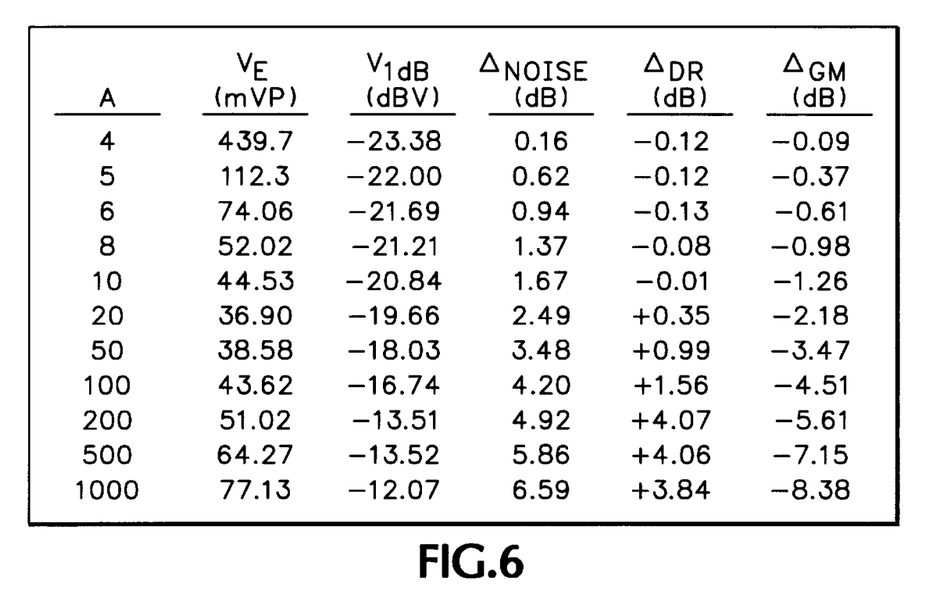
FIG. 6 is a tabulation of performance data for of the circuit of FIG. 5.

FIG. 6 shows a tabulation of performance data for the hybrid multi-tanh doublet of FIG. 5 using various values of emitter area ratio A. In FIG. 6, $V_E$ is the above-discussed optimized zero-signal voltage drop across emitter resistors R1 and R2 expressed in mVP. $V_{1dB}$ is a metric for the maximum signal handling capacity to the noise floor. The maximum signal handling capacity is defined (by arbitrary convention) as that sinusoidal input amplitude for which the cell output is 1 dB below the ideal (linear response) value, the so-called 1 dB compression point. This is expressed herein as voltage amplitude $V_{1dB}$, measured in dBV. In FIG. 6, $\Delta_{NOISE}$ is the noise difference, $\Delta_{DR}$ is the dynamic range improvement, and $\Delta_{GM}$ is the transconductance change. These are measured in decibels relative to the case where $A=A_0=3.732$.

As can be seen from the above-described tabulation, the hybrid multi-tanh doublet of FIG. 5 exhibits some unexpectedly useful properties for large values of A. These are now described with reference to FIG. 7, where values are plotted over the base input voltage $V_{IN}$ for the case of $A=500$, $R_E=63.33\ \Omega$, and $I_E=2$ mAP. The gain, (top curve, vertical axis in dB) is extremely flat. In fact, the gain deviation (middle curve, shown expanded with vertical axis in mdB) is within ±0.0014 dB over the central 200 mVP of the input range of $V_{IN}$. Further, the noise (bottom curve, vertical axis in nV/√Hz) at $V_{IN}=0$ is only 1.83 nV/√Hz including the noise of the emitter resistors. The noise is also very flat.

Figure 7:
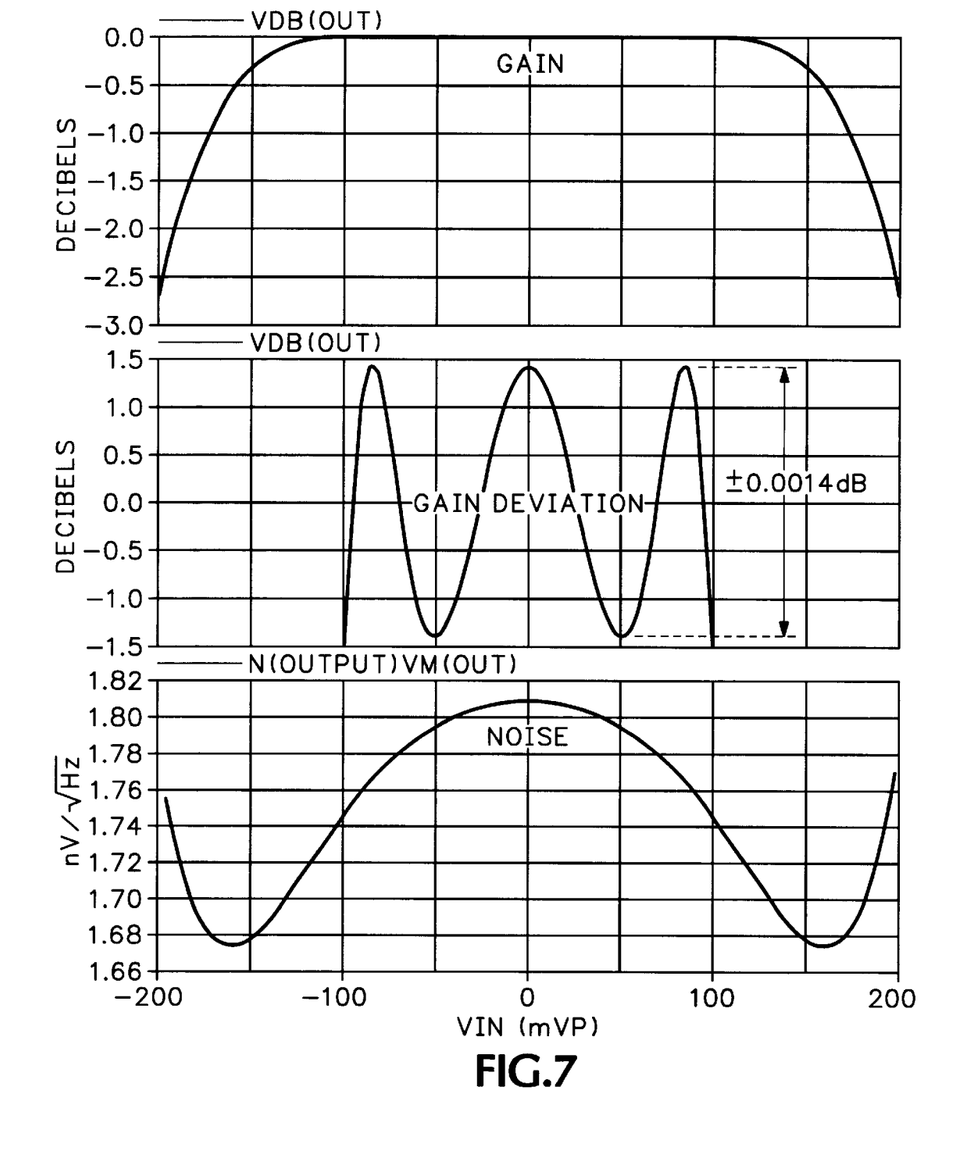
FIG. 7 shows graphs of the transconductance function, enlarged detail of the transconductance ripple, and input-referred noise spectral density for the circuit of FIG. 5 at an emitter area ratio A=500, all sharing the same horizontal axis of base input voltage.

Further, the $V_{1dB}$ point occurs at −11.2 dBV, and the third harmonic $H_3$ remains under −120 dBc for inputs up to −40 dBVP, which corresponds to an $IH_3$ of +20 dBVP.

Multi-Tanh Doublet Using Emitter Followers

With the circuit of FIG. 5, it would be impractical to use a value of A=500 directly by scaling the emitter areas, as it would result in huge parasitic capacitances, low current densities, and a corresponding loss of $f_T$. However, it can be effectively accomplished with the circuit of FIG. 8 which utilizes emitter-followers to introduce the equivalent offsets, or portions thereof, directly in the voltage domain.

Figure 8:
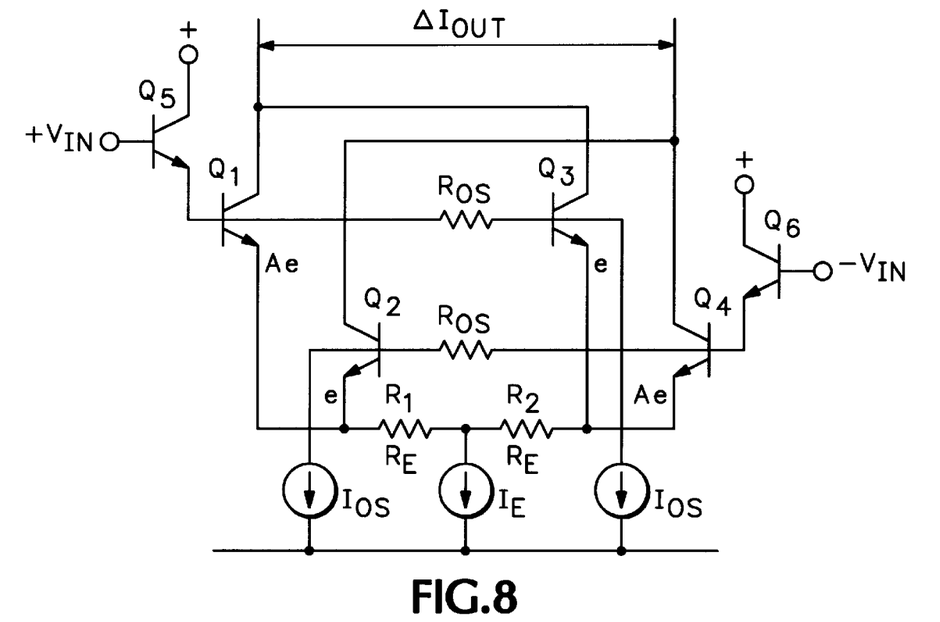
FIG. 8 is a circuit diagram of a variation of the circuit of FIG. 6 according to the present invention utilizing emitter followers.

Referring to FIG. 8, the multi-tanh doublet of FIG. 5 is additionally provided with a first resistor $R_{OS}$ connected between the bases of Q1 and Q3, and a second resistor $R_{OS}$ connected between the bases of Q2 and Q4. A first current source $I_{OS}$ is connected between the base of Q3 and power supply common, and a second current source $I_{OS}$ is connected between the base of Q2 and power supply common. A first emitter follower transistor Q5 has its collector connected to the positive power supply rail, its base coupled to receive $+V_{IN}$, and its emitter connected to the base of Q1, while a second emitter follower transistor Q6 has its collector connected to the positive power supply rail, its base coupled to receive $-V_{IN}$, and its emitter connected to the base of Q4.

The circuit of FIG. 8 avoids the need to implement a large actual emitter area ratio A. From Equation 1, to implement an equivalent area ratio of A=500, the voltage drop need only be a modest $V_T \ln 500=160$ mVP.

Although the input noise is somewhat increased with the circuit of FIG. 8 (due to shot noise in the emitter, and the Johnson noise of the base resistances and the offset generating resistors $R_{OS}$), this problem can be addressed by providing a portion of the effective area ratio through the use of a "real" emitter area ratio in the multi-tanh section and the remainder of the effective area ratio with the voltages $V_{OS}=I_{OS}R_{OS}$, which of course must be PTAT to maintain low distortion over temperature. For example, for an effective area ratio of 478, one might use a real emitter area ratio of 10 combined with $V_{OS}=100$ mVP. Since the effective area ratio can now be varied through control of $I_{OS}$, this may also be used to dynamically adjust the shape of the transfer function.

Series-Connected Multi-Tanh Doublet

Figure 9:
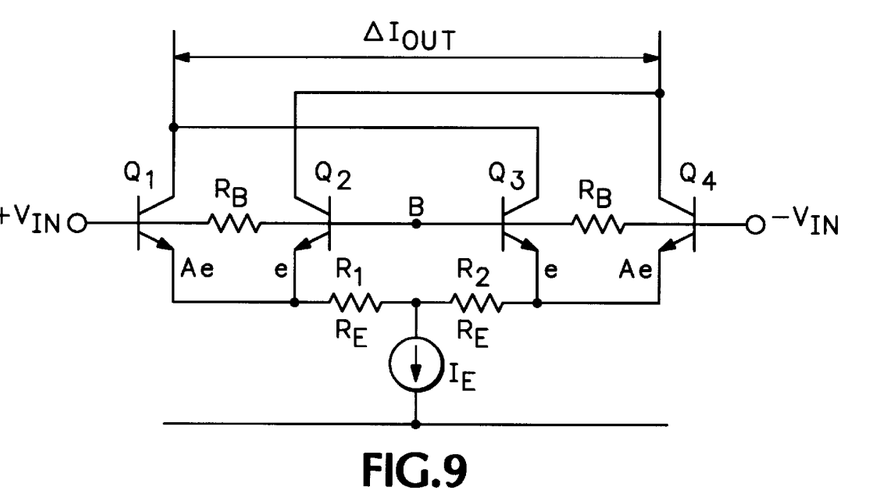
FIG. 9 is a circuit diagram of a series-connected hybrid multi-tanh doublet cell constructed according to a third embodiment of the invention.

FIG. 9 is a schematic diagram of a series-connected embodiment of the present invention. Again, it includes transistors Q1, Q2, Q3 and Q4, but the bases are connected differently than in the multi-tanh doublet of FIG. 5. The base of Q2 is connected directly to the base of Q3 (through a center base node B). A first bias resistor RB is connected between the bases of Q1 and Q2, and a second bias resistor RB is connected between the bases of Q3 and Q4. The input signals $+V_{IN}$ and $-V_{IN}$ are applied to the bases of Q1 and Q4, respectively.

A first advantage of the circuit of FIG. 9 is that it has exactly twice the signal capacity within the linear range than the simple parallel doublet, since resistors $R_B$ now divide $V_{IN}$ into two equal parts.

A second advantage is that there is no net noise contribution from either the Johnson noise of these resistors, or from the base shot noise currents from Q2 and Q3 which sum into the center base node B, provided that the source impedances at both input nodes are equal. This is because any common mode noise at node B causes equal but opposite phase noise currents in the inner transistors, which accordingly cancel out. A moderate mismatch in the source impedances does not seriously impair this noise cancellation. Consequently, the signal to noise ratio of this cell is similar to that of the simple parallel doublet. However, because the input voltage range is increased, the dynamic range is increased as well. This is a significant result, since the noise penalty would be much more severe if these same resistors were used as a voltage divider to drive a simple parallel doublet such as that of FIG. 1.

A third advantage of the circuit of FIG. 9 is that the high frequency (HF) displacement currents in the $C_{JC}$s of Q2 and Q3 will also cancel. This would leave (in the case of a single sided drive) only the AC current in the $C_{JC}$ of Q1. This advantage can be best exploited by placing the large-emitter devices on the inside thereby allowing the large displacement currents to cancel, so as to have a minimal effect on the HF response.

In the case of a single sided drive, the asymmetric HF signal coupling via the $C_{JC}$ of Q1 generates a troublesome right-plane zero. This can be eliminated by discarding the outer collector currents, if the concomitant halving of $g_m$ is tolerable.

The present invention provides cells with considerable benefits in the linearity of the transconductance function with very little additional complexity. The improvements come without a serious elevation of input-referred noise when low noise current sources are employed. Any loss in gain from including the resistors can be compensated for by scaling up the tail bias current.

A person skilled in the art will be able to practice the present invention in view of the present description, wherein numerous details have been set forth in order to provide a more thorough understanding of the invention. It will be obvious, however, to one skilled in the art that the present invention may be practiced without these specific details. In other instances, well known features have not been described in detail in order to avoid obscuring unnecessarily the present invention.

Having described and illustrated the principles of the invention in preferred embodiments thereof, it should be apparent that the invention can be modified without departing from such principles. All thus resulting modifications come within the spirit and the scope of the following claims.

What is claimed is:

1. A cell comprising:
   first, second, third and fourth transistors, each transistor having a base, an emitter and a collector, the base of the first transistor being coupled to the base of the third transistor, the base of the second transistor being coupled to the base of the fourth transistor, the collector of the first transistor being coupled to the collector of the third transistor, the collector of the second transistor being coupled to the collector of the fourth transistor;

a first bias current source;

a second bias current source;

a first resistor coupled between the emitter of the first transistor and the first bias current source;

a second resistor coupled between the emitter of the second transistor and the first bias current source;

a third resistor coupled between the emitter of the third transistor and the second bias current source; and a fourth resistor coupled between the emitter of the fourth transistor and the second bias current source.

2. The cell of claim 1, wherein a ratio of the emitter area of the first transistor to that of the second transistor equals a ratio of the resistance of the second resistor to that of the first resistor.

3. A cell comprising:

first, second, third and fourth transistors, each transistor having a base, an emitter and a collector, the base of the first transistor being coupled to the base of the third transistor, the base of the second transistor being coupled to the base of the fourth transistor, the collector of the first transistor being coupled to the collector of the third transistor, the collector of the second transistor being coupled to the collector of the fourth transistor;

a bias current source;

a first resistor having a first terminal coupled to the emitters of the first and second transistors and a second terminal coupled to the bias current source; and a second resistor having a first terminal coupled to the emitters of the third and fourth transistors and a second terminal coupled to the bias current source.

4. The cell of claim 3, wherein the first and second resistors have equal resistances.

5. The cell of claim 3 further comprising:

a first voltage drop means coupled between the base of the first transistor and the base of the third transistor for generating a first voltage drop therebetween;

a second voltage drop means coupled between the base of the second transistor and the base of the fourth transistor for generating a second voltage drop therebetween.

6. The cell of claim 5, wherein the first voltage drop equals the second voltage drop.

7. The cell of claim 5, wherein the first voltage drop means is a first offset resistor, the second voltage drop means is a second offset resistor, and wherein the cell further comprises:

first and second offset current sources for driving first and second offset currents respectively through the first and second offset resistors; and fifth and sixth transistors with emitters connected to the bases of the first transistor and of the fourth transistor, respectively.

8. The cell of claim 7, wherein the first emitter resistor and the second emitter resistor have equal resistances.

9. A cell comprising:

first, second, third and fourth transistors, each having a base, an emitter and a collector, the base of the first transistor being coupled to the base of the second transistor through a first offset resistor, the base of the second transistor being coupled to the base of the third transistor, the base of the third transistor being coupled to the base of the fourth transistor through a second offset resistor, the collector of the first transistor being coupled to the collector of the third transistor, the collector of the second transistor being coupled to the collector of the fourth transistor;

a bias current source;

a first emitter resistor having a first terminal coupled to the emitters of the first and second transistors and a second terminal coupled to the bias current source; and a second emitter resistor having a first terminal coupled to the emitters of the third and fourth transistors and a second terminal coupled to the bias current source.

10. The cell of claim 9, wherein the first emitter resistor and the second emitter resistor have equal resistances.

11. The cell of claim 9, wherein the first offset resistor and the second offset resistor have equal resistances.

12. A cell comprising:

first, second, third and fourth transistors, each having a base, an emitter and a collector, wherein the first and second transistors are arranged to form a differential pair having their emitters coupled together at a first node, and the third and fourth transistors are arranged to form a second differential pair having their emitters coupled together at a second node, and wherein the bases of each differential pair of the transistors are coupled through an offset resistor so that currents through the collectors add in phase;

a bias current source;

a first resistor coupled between the first node and the bias current source; and a second resistor coupled between the second node and the bias current source.

* * * * *

UNITED STATES PATENT AND TRADEMARK OFFICE
CERTIFICATE OF CORRECTION

PATENT NO. : 6,087,883
DATED : July 11, 2000
INVENTOR(S) : Gilbert et al.

It is certified that error appears in the above-identified patent and that said Letters Patent is hereby corrected as shown below:

Abstract,
Line 17, should be a space between "A" and "series"

Column 1,
Line 7, the word "Ser." should be omitted

Column 2,
Line 24, the word "a" is repeated; one "a" should be omitted

Column 3,
Line 20, the word "of" in "of the circuit" should be omitted

Column 4,
Line 3, "$R_E=_{1173}$" should read -- $R_E=1173$ --

Column 6,
Line 1, "RB" should read -- $R_B$ --

Column 7,
Line 12, the word "a" should be replaced with -- the --

Signed and Sealed this

Thirteenth day of November, 2001

Attest:

*Nicholas P. Godici*

NICHOLAS P. GODICI
*Attesting Officer*   *Acting Director of the United States Patent and Trademark Office*